United States Patent [19]

Unami

[11] Patent Number: 5,925,971
[45] Date of Patent: Jul. 20, 1999

[54] PIEZOELECTRIC RESONATOR AND ELECTRONIC COMPONENT CONTAINING SAME

[75] Inventor: Toshihiko Unami, Omihachiman, Japan

[73] Assignee: Murata Manufacturing Co., Ltd., Kyoto, Japan

[21] Appl. No.: 08/846,553

[22] Filed: Apr. 29, 1997

Related U.S. Application Data

[30] Foreign Application Priority Data

Sep. 12, 1996 [JP] Japan ................................. 8-265529

[51] Int. Cl.$^6$ ................................................ H01L 41/08
[52] U.S. Cl. ........................... 310/328; 310/348; 310/366
[58] Field of Search ................................. 310/328, 348, 310/357, 366

[56] References Cited

U.S. PATENT DOCUMENTS

| | | | |
|---|---|---|---|
| 2,157,665 | 5/1939 | Hollmann | 310/315 |
| 3,185,869 | 5/1965 | Shoor | 310/315 |
| 3,297,889 | 1/1967 | Breskend | 310/315 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,360,754 | 11/1982 | Toyoshima et al. | 310/366 |
| 4,398,117 | 8/1983 | St. Cyr | 310/348 |
| 4,456,394 | 6/1984 | Kolm et al. | 30/357 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,780,639 | 10/1988 | Shirasu | 310/328 |
| 4,885,498 | 12/1989 | Wakita | 310/328 |
| 4,937,489 | 6/1990 | Hattori et al. | 310/328 |
| 4,958,100 | 9/1990 | Crawley et al. | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,168,189 | 12/1992 | Dam et al. | 310/328 |
| 5,208,506 | 5/1993 | Yamashita | 310/328 |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |

(List continued on next page.)

FOREIGN PATENT DOCUMENTS

| | | | |
|---|---|---|---|
| 60-196981 | 10/1985 | Japan | 310/366 |
| 62-88382 | 4/1987 | Japan | 310/328 |
| 2-291184 | 11/1990 | Japan | 310/357 |
| 3-159277 | 7/1991 | Japan | 310/328 |
| 3-243358 | 10/1991 | Japan | 310/328 |
| 5-160459 | 6/1993 | Japan | 310/366 |

*Primary Examiner*—Thomas M. Dougherty
*Attorney, Agent, or Firm*—Graham & James LLP

[57] ABSTRACT

A piezoelectric resonator has a base member including a plurality of piezoelectric layers laminated with electrodes disposed therebetween. A first vibrating section is formed so as to occupy most of the base member. In the first vibrating section, adjacent piezoelectric layers sandwiching one electrode therebetween are polarized in opposite directions in the longitudinal direction of the base member. At both sides of the first vibrating section, second vibrating sections are formed. A piezoelectric layer of each of the second vibrating sections is polarized in the same direction as an adjacent piezoelectric layer in the first vibrating section with an electrode disposed therebetween. An electric field is applied in opposite directions to adjacent piezoelectric layers disposed on both sides of an electrode in the base member.

17 Claims, 14 Drawing Sheets

U.S. PATENT DOCUMENTS

| | | | |
|---|---|---|---|
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,639,508 | 6/1997 | Okawa et al. | 310/328 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |
| 5,825,262 | 10/1998 | Inoue et al. | 310/328 |
| 5,828,160 | 10/1998 | Sugishita | 310/366 |

10a(10b,10c,10d)

10

PIEZOELECTRIC RESONATOR AND ELECTRONIC COMPONENT CONTAINING SAME

BACKGROUND OF THE INVENTION

1. Field of the Invention

The present invention relates to a novel piezoelectric resonator and electronic components containing such novel piezoelectric resonators, and more particularly, to a novel piezoelectric resonator which maximizes the effective use of mechanical resonance of a piezoelectric member, and electronic components containing such a novel piezoelectric resonator, such as a ladder filter, an oscillator, a discriminator, and a filter.

2. Description of the Related Art

FIG. 18 is a perspective view of a piezoelectric resonator which the applicant has disclosed in Japanese patent application No. 8-110475 filed in the Japanese Patent Office and which has not yet been published or laid open. Japanese Patent Application No. 8-110475 corresponds to U.S. patent application Ser. No. 08/829,597, (Attorney Docket No. 36856.22) for "PIEZOELECTRIC RESONATOR AND ELECTRONIC COMPONENT CONTAINING SAME," the disclosure of which is hereby incorporated by reference. FIG. 19 is a view showing the internal structure of the piezoelectric resonator shown in FIG. 18. A piezoelectric resonator 1 preferably includes a base member 2 having, for example, a substantially rectangular-parallelpiped shape. The base member 2 is formed by integrally laminating a plurality of piezoelectric layers with electrodes 3 disposed therebetween. The piezoelectric layers are preferably made from piezoelectric ceramic. The electrodes 3 are disposed such that major surfaces thereof are substantially perpendicular to a longitudinal direction of the base member 2 and such that the electrodes 3 are spaced by a certain interval therebetween.

The piezoelectric layers are polarized in opposite directions at both sides of electrodes 3 in the longitudinal direction of the base member 2 as shown in FIG. 19, and thereby, a vibrating section 4 is formed as shown by hatching in FIG. 19. Since electrodes are not disposed at the opposite ends of the base member 2 in the longitudinal direction in the piezoelectric resonator 1, the piezoelectric layers disposed at the opposite ends of the base member 2 serve as piezoelectrically inactive dummy layers "d."

On opposite side surfaces of the base member 2, a plurality of insulating films 5 and 6 are disposed, respectively. On one side surface of the base member 2, alternate exposed portions of the electrodes 3 are covered by the insulating film 5. On the other side surface of the base member 2, alternate exposed portions of the electrodes 3 which are not covered by the insulating film 5 on the above-described side surface are covered by the insulating film 6.

On the side surfaces of the base member 2 on which the insulating films 5 and 6 are disposed defining connection sections, external electrodes 7 and 8 are provided. Therefore, the external electrode 7 is connected to electrodes 3 which are not covered by the insulating film 5 and the external electrode 8 is connected to electrodes 3 which are not covered by the insulating film 6. In other words, adjacent electrodes among the electrodes 3 are connected to the external electrodes 7 and 8, respectively. The external electrodes 7 and 8 are used as input and output electrodes.

FIGS. 20A and 20B illustrate vibration conditions in the piezoelectric resonator shown in FIGS. 18 and 19. The piezoelectric resonator 1 shown in FIGS. 20A and 20B has the same structure as the piezoelectric resonator described above.

Among three rows of arrows shown in the base member 2 of the piezoelectric resonator 1 in FIGS. 20A and 20B, the upper row of arrows indicate the direction in which an electric field is applied, the middle row of white arrows indicate the direction of polarization, and the lower row of arrows indicate the direction in which each piezoelectric layer expands and contracts in the stiffened piezoelectric resonator.

when an AC signal, which changes its direction of voltage as time elapses, is applied to the piezoelectric resonator 1, the base member 2 alternately changes its condition between the conditions shown in FIG. 20A and FIG. 20B to vibrate in the longitudinal direction. In other words, when an electric field is applied to each piezoelectric layer in the same direction as the direction of polarization as shown in FIG. 20A, each piezoelectric layer expands in the longitudinal direction of the base member 2 and the base member 2 as a whole expands in the longitudinal direction. On the other hand, when an electric field is applied to each piezoelectric layer in the direction opposite to the direction of polarization as shown in FIG. 20B, each piezoelectric layer contracts in the longitudinal direction of the base member 2 and the base member 2 contracts as a whole in the longitudinal direction. These operations are repeated, and the base member 2 vibrates in the longitudinal direction.

The piezoelectric resonator 1 has a structure in which each piezoelectric layer expands and contracts in the same direction when an electric field is applied, as shown in FIGS. 20A and 20B. In other words, each piezoelectric layer has a driving force in the same direction, generated due to the inverse piezoelectric effect. Therefore, an input signal is efficiently converted to mechanical vibration in the piezoelectric resonator 1, and it can have a larger electromagnetic coupling coefficient and also have a relatively large ΔF, which is a difference between the resonant frequency Fr and the antiresonant frequency Fa. A resonator having a large ΔF is well suited for use, for example, as a wide-frequency-band filter.

A narrow-frequency-band filter and an oscillator may, however, require a small ΔF. To obtain a small ΔF in the piezoelectric resonator 1 described in FIGS. 18 to 20B, the area of each electrode, or the size or thickness of the piezoelectric layers must be changed which is difficult and requires a significant amount of time and effort.

SUMMARY OF THE INVENTION

To overcome the problems described above, the preferred embodiments of the present invention provide a piezoelectric resonator having a small ΔF and a structure which makes the resonator well suited for use as a narrow-frequency-band filter and an oscillator.

According to the preferred embodiments of the present invention, a piezoelectric resonator comprises a base member; a laminated member section constituting a part of the base member which includes a plurality of piezoelectric layers polarized in a longitudinal direction of the base member and a plurality of internal electrodes disposed in the base member so as to be substantially perpendicular to the longitudinal direction of the base member; and a pair of external electrodes disposed on a common side surface or different side surfaces of the base member and being connected to the plurality of internal electrodes located in the base member, wherein the laminated member section includes a first vibrating section and a second vibrating section; when an electric field is applied to at least one piezoelectric layer of the first vibrating section in the same direction as the direction of polarization of the at least one piezoelectric layer of the first vibrating section, an electric field is applied to at least one piezoelectric layer of the second vibrating section in a direction opposite to the direction of polarization of the at least one piezoelectric layer of the second vibrating section; and, when an electric field is applied to the at least one piezoelectric layer of the first vibrating section in a direction opposite to the direction of polarization of the at least one piezoelectric layer of the first vibrating section, an electric field is applied the to at least one piezoelectric layer of the second vibrating section in the same direction as the direction of polarization of the at least one piezoelectric layer of the second vibrating section.

According to a further preferred embodiment of the present invention, an electronic component contains the above-described piezoelectric resonator, wherein a support member for supporting the base member comprises an insulating substrate having a pattern electrode disposed thereon; the base member is mounted on the insulating substrate via a mounting member for supporting a center section of the base member of the piezoelectric resonator; and a cap is disposed on the insulating substrate so as to cover the base member.

According to yet a further preferred embodiment of the present invention, an electronic component includes the above-described piezoelectric resonators, wherein a support member for supporting the base member preferably includes an insulating substrate having a pattern electrode disposed thereon; a plurality of the piezoelectric resonators connected in a ladder arrangement in series and in parallel are mounted on the insulating substrate via mounting members for supporting center sections of the base members in the longitudinal direction; and a cap is disposed on the insulating substrate so as to cover the base members.

In a piezoelectric resonator according to the preferred embodiments of the present invention, longitudinal basic vibration is excited in the base member when an electric field is applied in the longitudinal direction of the base member. Because the directions of polarization, electric field application and vibration are all the same, the resonator is a stiffened type resonator and generates vibration characteristic of a stiffened piezoelectric resonator. Therefore, vibrations in modes such as the width and thickness modes, which are different from the basic vibration, are unlikely to occur and superior resonator characteristics are obtained.

Since the first and second vibrating sections of the base member in which longitudinal basic vibration is generated vibrate in phases which are opposite to each other in a piezoelectric resonator according to the preferred embodiments of the present invention, ΔF is substantially reduced.

When an electronic component such as a ladder filter, an oscillator, a discriminator, and a filter is constructed using this novel piezoelectric resonator, the piezoelectric resonator is mounted on an insulating substrate having pattern electrodes disposed thereon and is covered by a cap to form chip-type, surface-mountable electronic components.

By adjusting the ratio or positional relationship between the second vibrating section and the first vibrating section in a piezoelectric resonator according to the preferred embodiments of the present invention, ΔF can be selected from a wide range without changing the dimensions of the piezoelectric resonator and to thereby easily achieve various desired values of ΔF.

According to the preferred embodiments of the present invention, a piezoelectric resonator having a small ΔF is achieved. Therefore, a piezoelectric resonator which has a structure which is well suited to a narrow-frequency-band filter and an oscillator is provided.

Since a chip-type electronic component can be constructed using the piezoelectric resonator, it is easy to mount the component on a circuit board.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
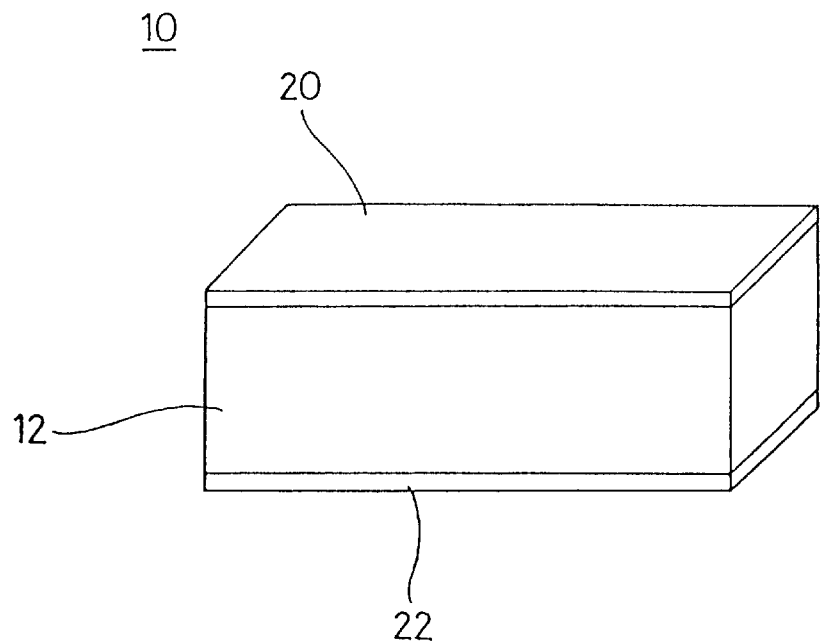
FIG. 1 is a perspective view of a piezoelectric resonator according to the preferred embodiments of the present invention.
Figure 2:
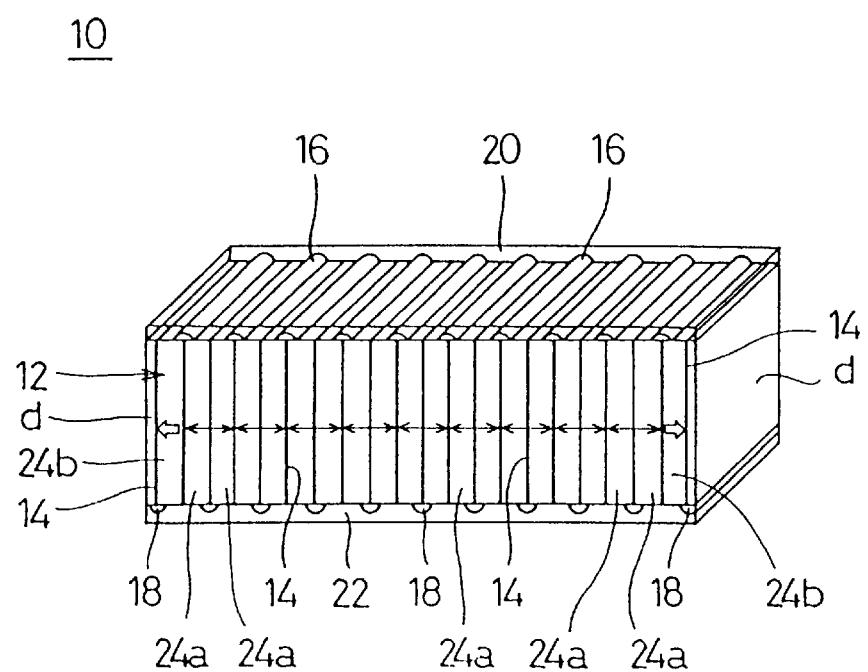
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. The piezoelectric resonator 10 preferably includes a base member 12 having, for example, a substantially rectangular-parallelpiped shape. The base member 12 preferably has a laminated member structure formed by laminating a plurality of piezoelectric layers with electrodes 14 disposed therebetween. The laminated member includes a first vibrating section 24a and second vibrating sections 24b. The piezoelectric layers are made from piezoelectric ceramic. A plurality of electrodes 14 are arranged in the base member 12 such that major surfaces thereof are substantially perpendicular to a longitudinal direction of the base member 12 and the electrodes are spaced from each other at a desired interval therebetween.

The first vibrating section 24a preferably occupies most of the base member 12 in the piezoelectric resonator 10 and generates longitudinal basic vibration in the base member 12. In the first vibrating section 24a, adjacent piezoelectric layers having one of the electrodes 14 disposed therebetween are polarized in opposite directions in the longitudinal direction of the base member 12 as shown by black arrows in FIG. 2.

Second vibrating sections 24b are preferably provided at both sides of the first vibrating section 24a. The second vibrating sections 24b are arranged to reduce ΔF of the piezoelectric resonator 10 while only slightly preventing vibration efficiency in the first vibrating section 24a. The piezoelectric layer of each of the second vibrating sections 24b is preferably polarized in the same direction as the adjacent piezoelectric layer of the first vibrating section 24a with one of the electrodes 14 disposed therebetween, as shown by white arrows in FIG. 2. At both sides of the vibrating sections 24b, dummy layers "d" are formed. The dummy layers "d" need not be formed if not required.

On opposing side surfaces of the base member 12, a plurality of insulating films 16 and 18 are provided, respectively. On one side surface of the base member 12, the insulating film 16 covers the exposed section of every other electrode 14. On the other side surface of the base member 12, the insulating film 18 covers the exposed section of every other electrode 14 not covered by the insulating film 16 on the above-described side surface. The two side surfaces of the base member 12 on which the insulating films 16 and 18 are disposed serve as connection sections to external electrodes, which will be described later.

In these connection sections, the side surfaces of the base member 12 on which the insulating films 16 and 18 are disposed, external electrodes 20 and 22 are provided. The external electrode 20 is preferably connected to electrodes 14 which are not covered by the insulating film 16, and the external electrode 22 is preferably connected to electrodes 14 which are not covered by the insulating film 18. In other words, adjacent electrodes 14 are connected to the external electrodes 20 and 22, respectively. The external electrodes 20 and 22 are used as input and output electrodes in this piezoelectric resonator 10. Since an electric field is applied between adjacent electrodes 14, the base member is piezoelectrically active.

Figure 3A:
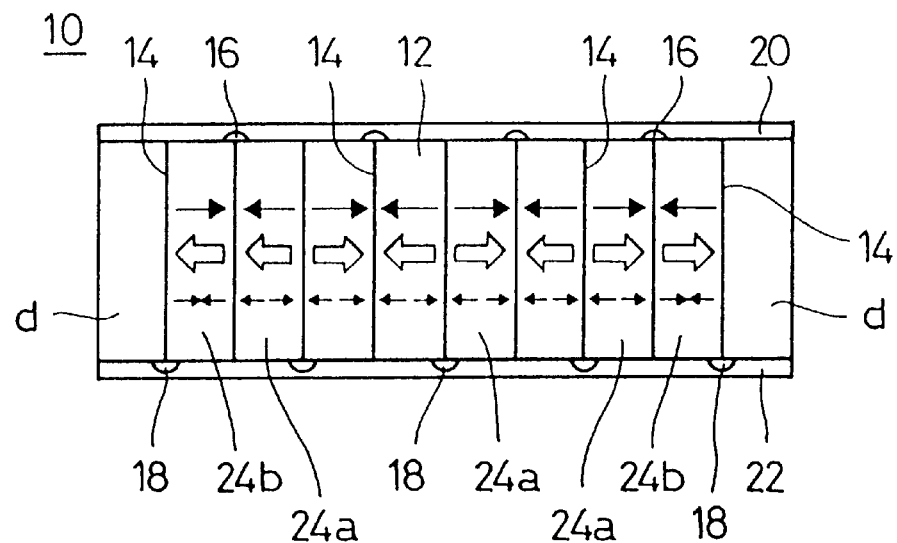
FIGS. 3A and 3B illustrate vibration conditions of the piezoelectric resonator shown in FIGS. 1 and 2.
Figure 3B:
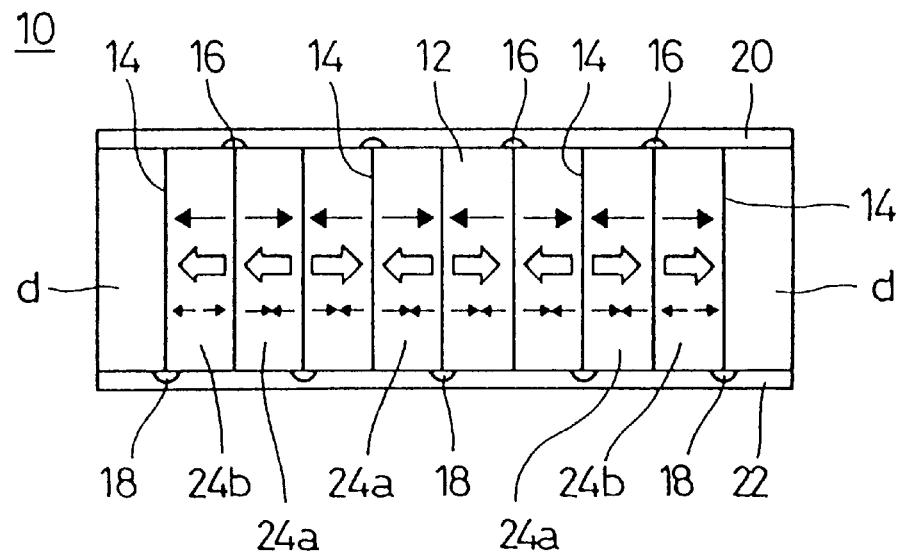

FIGS. 3A and 3B illustrate vibration conditions in the piezoelectric resonator shown in FIGS. 1 and 2. The piezoelectric resonator 10 shown in FIGS. 3A and 3B has the same structure as the piezoelectric resonator shown in FIGS. 1 and 2.

Among three rows of arrows shown in the base member 12 of the piezoelectric resonator 10 in FIGS. 3A and 3B, the upper row of arrows indicate the direction in which an electric field is applied, the middle row of white arrows indicate the direction of polarization, and the lower row of arrows indicate the direction in which each piezoelectric layer expands and contracts in the stiffened piezoelectric resonator.

When an AC signal, which changes its direction of voltage as time elapses, is input to the external electrodes 20 and 22 of the piezoelectric resonator 10, an electric field is applied in opposite directions to adjacent piezoelectric layers disposed at both sides of an electrode 14, constituting the base member 12, and longitudinal basic vibration is generated such that a node is defined at a center of the base member 12. The base member 12 alternately changes its condition between those shown in FIG. 3A and FIG. 3B to thereby vibrate in the longitudinal direction.

When an electric field is applied to each piezoelectric layer in the first vibrating section 24a in the same direction as the direction of polarization as shown in FIG. 3A, each piezoelectric layer expands in the longitudinal direction of the base member 12 and the base member 12 as a whole expands in the longitudinal direction. Since an electric field is applied to each piezoelectric layer of the second vibrating sections 24b in the direction opposite that of polarization, however, the second vibrating sections 24b contract in the longitudinal direction of the base member 12 when the first vibrating section 24a expands in the longitudinal direction.

On the other hand, when an electric field is applied to each piezoelectric layer in the direction opposite to the direction polarization as shown in FIG. 3B, each piezoelectric layer contracts in the longitudinal direction of the base member 12 and the base member 12 as a whole contracts in the longitudinal direction as a whole. Since an electric field is applied to each piezoelectric layer of the second vibrating sections 24b in the same direction as that of polarization, however, the second vibrating sections 24b expand in the longitudinal direction of the base member 12 when the first vibrating section 24a contracts in the longitudinal direction.

Figure 4:
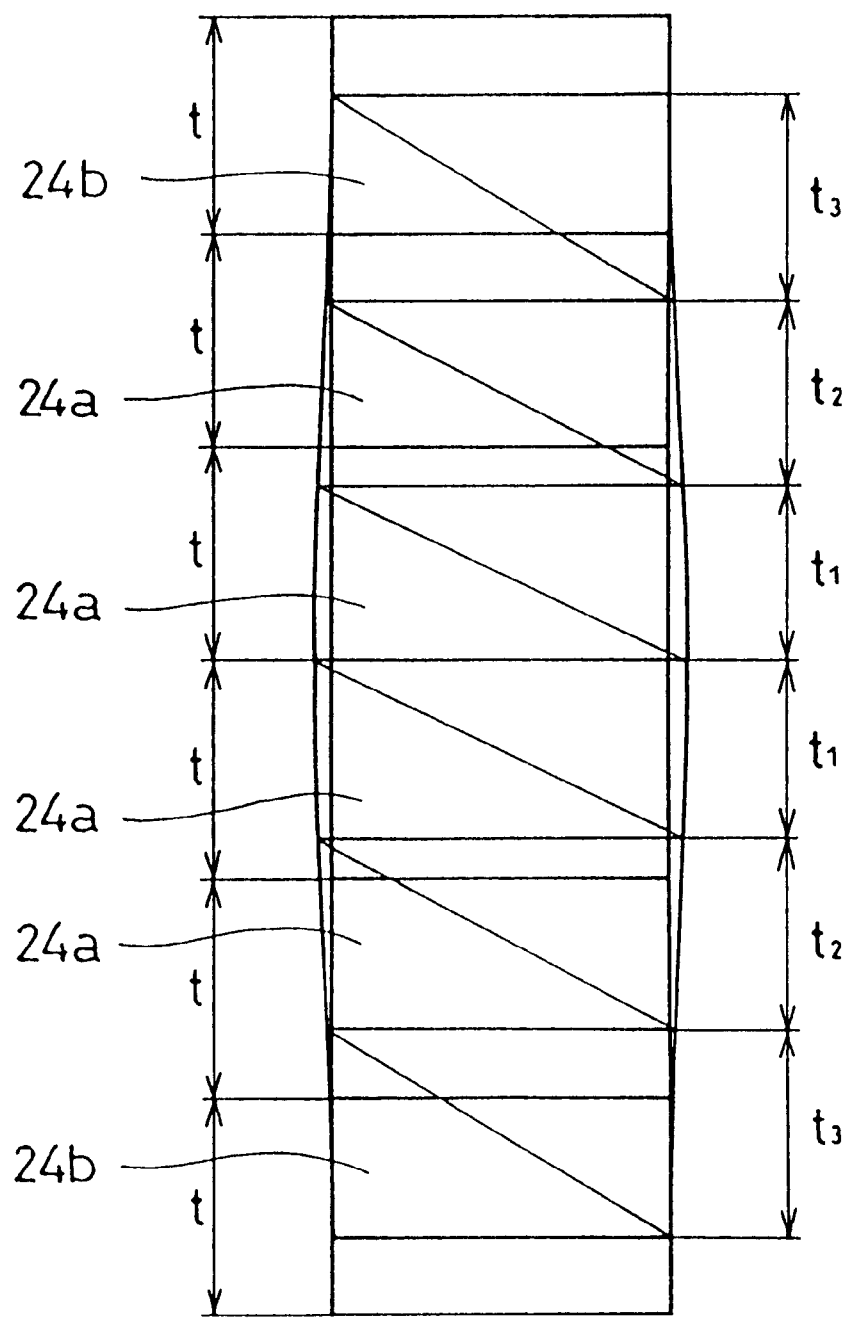
FIG. 4 is a view showing changes in thickness of each piezoelectric layer during vibration in a piezoelectric resonator of the preferred embodiments of the present invention.

FIG. 4 is a view showing changes in thickness of each piezoelectric layer during vibration in the piezoelectric resonator 10 according to the preferred embodiments of the present invention. In FIG. 4, the thickness of each piezoelectric layer before contraction of the base member 12 is indicated by t, and the thicknesses of the piezoelectric layers after contraction are indicated by $t_1$, $t_2$, and $t_3$. These thicknesses preferably have a relationship of $t>t_3>t_2>t_1$. The piezoelectric layers which are disposed closer to the center of the base member 12 contract more than the piezoelectric layers disposed farther away from the center of the base member 12.

As described above, in the piezoelectric resonator 10 shown in FIGS. 1 to 3B, the second vibrating sections 24b, which occupy a part of the base member 12 in which longitudinal basic vibration is generated, vibrate in the direction opposite to the direction of vibration in the first vibrating section 24a, which occupies most of the base member 12. Therefore, the vibration efficiency in the first vibrating section 24a is slightly decreased and ΔF of the piezoelectric resonator 10 is reduced. Hence, a piezoelectric resonator which has a structure which is well suited to a narrow-frequency-band filter and an oscillator is obtained.

In addition, since the piezoelectric resonator 10 is a stiffened type resonator and longitudinal basic vibration is excited in the resonator 10, vibrations in modes such as the width and thickness modes, which are different from the basic vibration, are unlikely to occur and superior resonator characteristics are achieved.

By adjusting the ratio or positional relationship between the second vibrating sections 24b and the first vibrating section 24a in the piezoelectric resonator 10, ΔF can be selected from a wide range as a result of its structure, without changing the dimensions of the piezoelectric resonator 10 and thereby allowing various values of ΔF to be achieved easily. In the preferred embodiment shown in FIGS. 1 and 2, for example, the second vibrating sections 24b are preferably disposed at both sides of the first vibrating section 24a. The structure is not limited to that arrangement in this preferred embodiment. The second vibrating sections 24b may be also disposed substantially at the center of the base member 12.

In the piezoelectric resonator 10, the second vibration sections 24b are preferably disposed at both sides of the first vibrating section 24a, one layer at each side. The structure is not limited to this arrangement. Only one layer of a second vibrating section 24b may be disposed adjacent the first vibrating section 24a. A plurality of layers of the second vibrating sections 24b may also be provided.

Figure 5:
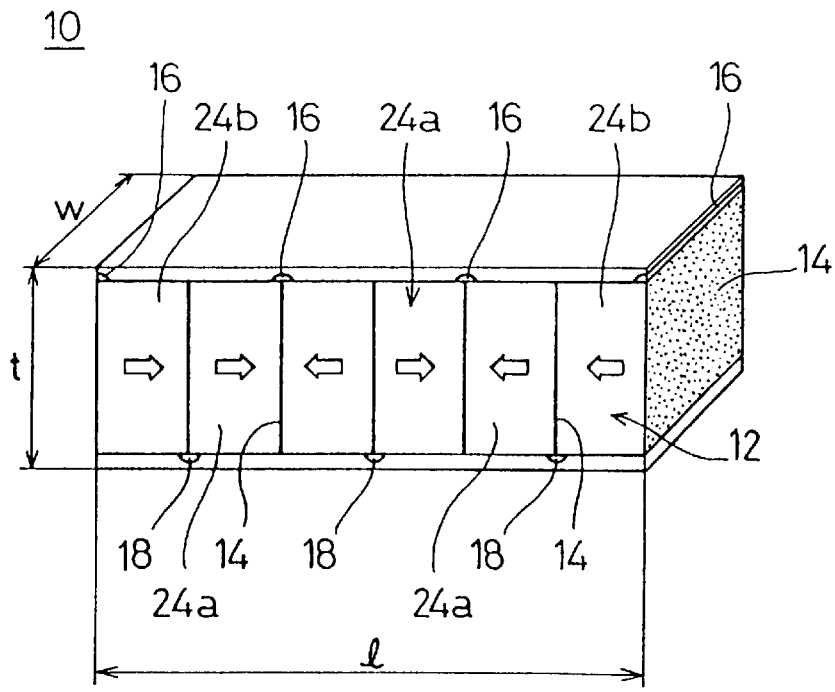
FIG. 5 is a view of a piezoelectric resonator according to the preferred embodiments of the present invention used for checking the characteristics.
Figure 6:
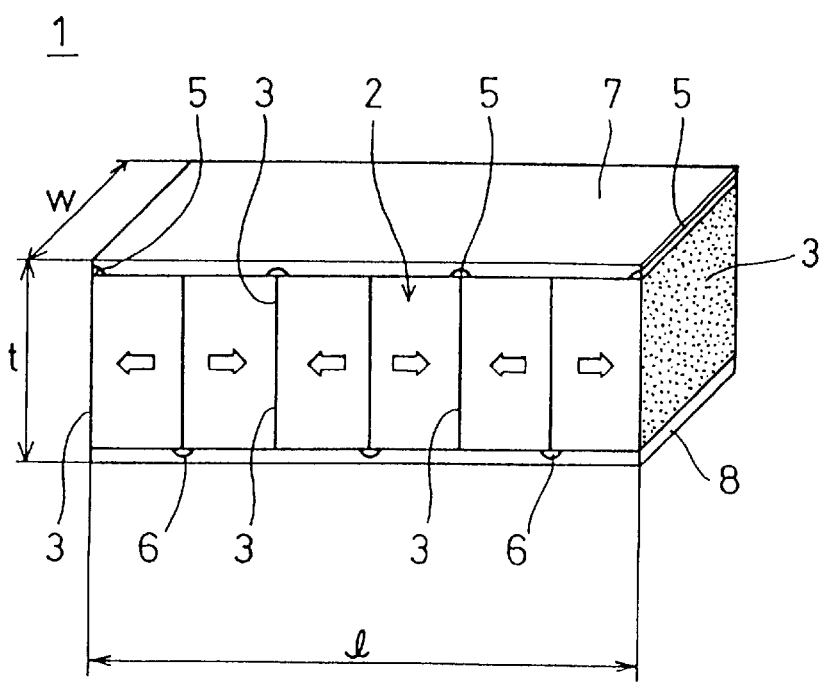
FIG. 6 is a view of a piezoelectric resonator shown for comparison.

FIG. 5 is a view showing a piezoelectric resonator according to the preferred embodiments of the present invention for checking the characteristics. FIG. 6 shows a piezoelectric resonator for comparison.

A piezoelectric resonator 10 shown in FIG. 5 measures approximately 3.78 mm in length, 1.0 mm in height, and 1.0 mm in width. At the center of a base member 12 of the piezoelectric resonator 10, a first vibrating section 24a is provided by laminating four piezoelectric layers with electrodes 14 sandwiched therebetween. Second vibrating sections 24b in each of which one piezoelectric layer is sandwiched by electrodes 14 are integrally formed with the first vibrating section 24a at both sides of the first vibrating section 24a. At each end of the base member 12, an electrode 14 is disposed. The piezoelectric layers constituting the base member 12 preferably have the same thickness.

The piezoelectric resonator 1 for comparison shown in FIG. 6. has the same dimensions as the piezoelectric resonator 10 shown in FIG. 5. A base member 2 of the piezoelectric resonator 1 is formed by integrally laminating six piezoelectric layers with electrodes 3 sandwiched therebetween. At each end of the base member 2, an electrode is disposed. The piezoelectric layers constituting the base member 2 have the same thickness.

In FIGS. 5 and 6, white arrows indicate the directions of polarization in the piezoelectric layers. In the piezoelectric resonator 10 according to a preferred embodiment of the present invention shown in FIG. 5, the piezoelectric layers constituting the second vibrating sections 24b are polarized in the same direction as the adjacent piezoelectric layer of the first vibrating section 24a with the electrode 14 placed therebetween. The first vibrating section 24a and the second vibrating sections 24b vibrate in opposite phases.

On the other hand, in the piezoelectric resonator 1 shown in FIG. 6 for comparison, adjacent piezoelectric layers with an electrode 3 disposed therebetween are polarized in opposite directions in the longitudinal direction of the base member 2. The piezoelectric resonator 1 does not have a second vibrating section.

To examine a difference in characteristics between these two piezoelectric resonators, the finite-element method is used to calculate the resonant frequencies Fr and the anti-resonant frecuencies Fa of the piezoelectric resonator 10 shown in FIG. 5 and the piezoelectric resonator 1 shown in FIG. 6, and their difference ΔF. Table 1 shows the results.

TABLE 1

|  | Fr (kHz) | Fa (kHz) | ΔF (kHz) |
| --- | --- | --- | --- |
| Piezoelectric resonator of this prevention | 470.3 | 503.7 | 33.4 |
| piezoelectric resonator for comparison | 470.3 | 531.2 | 60.9 |

As shown in Table 1, the piezoelectric resonator 10 shown in FIG. 5 has a smaller ΔF than the piezoelectric resonator 1 shown for comparison in FIG. 6.

Figure 7A:
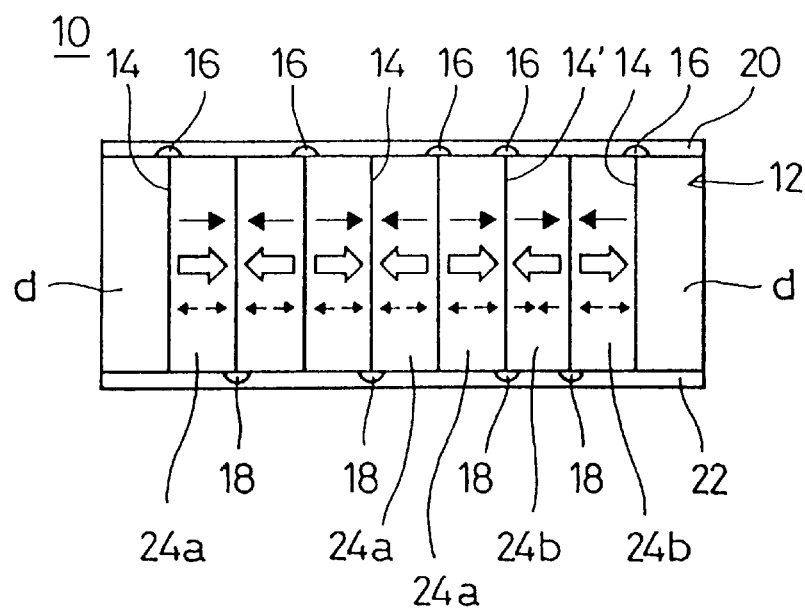
FIGS. 7A and 7B illustrate a structure and vibration conditions of another piezoelectric resonator according to the preferred embodiments of the present invention.
Figure 7B:
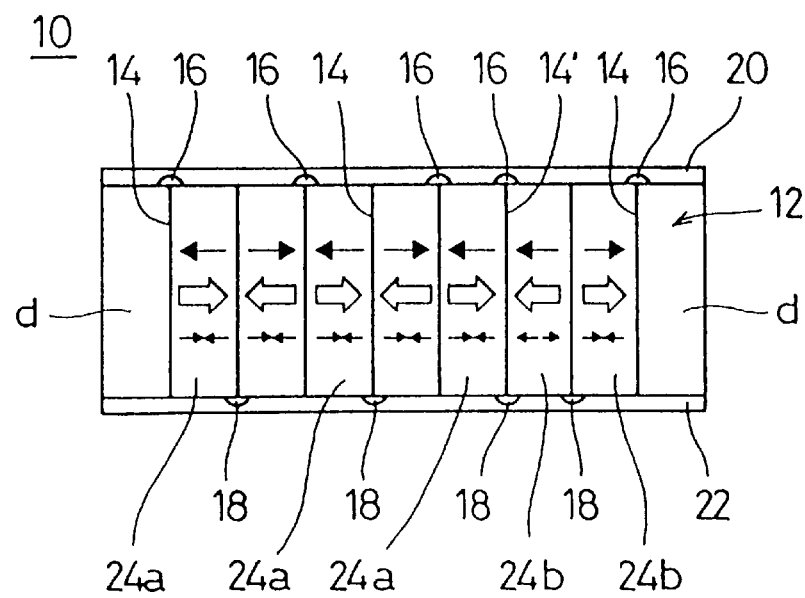

FIGS. 7A and 7B illustrate a structure and vibration conditions of another piezoelectric resonator according to the preferred embodiments of the present invention. Among three rows of arrows shown in the base member 12 of a piezoelectric resonator 10 in FIGS. 7A and 7B, the upper row of arrows indicate the direction in which an electric field is applied, the middle row of white arrows indicate the direction of polarization, and the lower row of arrows indicate the direction in which each piezoelectric layer expands and contracts in the stiffened piezoelectric resonator.

The piezoelectric resonator 10 shown in FIGS. 7A and 7B differs from the piezoelectric resonator shown in FIG. 2 in direction of polarization in a piezoelectric layer of a second vibrating section 24b and in arrangement of insulating films 16 and 18.

In the piezoelectric resonator 10 shown in FIGS. 7A and 7B, a second vibrating section 24b is disposed at the right-hand side of the base member 12. The second vibrating section 24b is preferably made up of one piezoelectric layer sandwiched by an electrode 14 and a dummy electrode 14'.

In the piezoelectric resonator 10, the piezoelectric layer constituting the second vibrating section 24b is polarized in the direction opposite that of the piezoelectric layer in a first vibrating section 24a disposed adjacent with the dummy electrode 14' placed therebetween.

The dummy electrode 14' is insulated by the insulating films 16 and 18 at both side surfaces of the base member 12 and not connected to external electrodes 20 and 22. The electrode 14 disposed immediately at the left of the dummy electrode 14' in FIGS. 7A and 7B is insulated by the insulating film 16, is not connected to the external electrode 20, and is connected to the external electrode 22. The electrode 14 disposed immediately to the right of the dummy electrode 14' in FIGS. 7A and 7B is insulated by the insulating film 18, is not connected to the external electrode 22, and is connected to the external electrode 20. Therefore, as shown in FIGS. 7A and 7B, an electric field is applied to the piezoelectric layers disposed at both sides of the dummy electrode 14' in the same direction in the longitudinal direction of the base member 12, that is, from one end to the other end, or vice versa.

With this structure, when an electric field is applied to the piezoelectric layer of the first vibrating section 24a in the same direction as that of polarization, an electric field is applied to the piezoelectric layer of the second vibrating section 24b in the direction opposite that of polarization. On the other hand, when an electric field is applied to the piezoelectric layer of the first vibrating section 24a in the direction opposite that of polarization, an electric field is applied to the piezoelectric layer of the second vibrating section 24b in the same direction as that of polarization. Therefore as shown by the lower rows of arrows in FIGS. 7A and 7B, the first vibrating section 24a and the second vibrating section 24b vibrate in opposite phases.

Hence, the piezoelectric resonator 10 shown in FIGS. 7A and 7B also achieves the same advantages as the piezoelectric resonator described by referring to FIGS. 1 to 6.

Figure 8A:
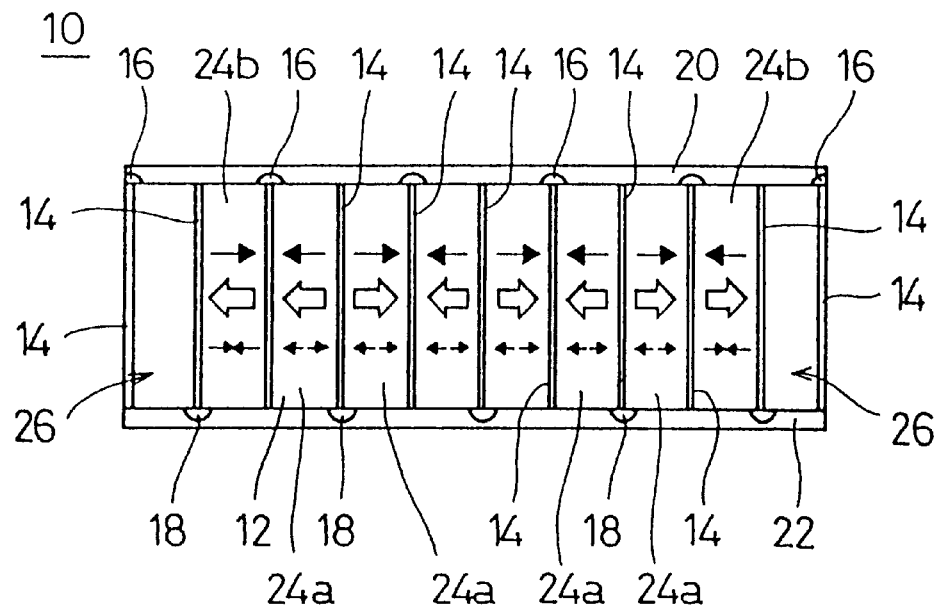
FIGS. 8A and 8B illustrate a structure and vibration conditions of still another preferred embodiment of the piezoelectric resonator according to the present invention.
Figure 8B:
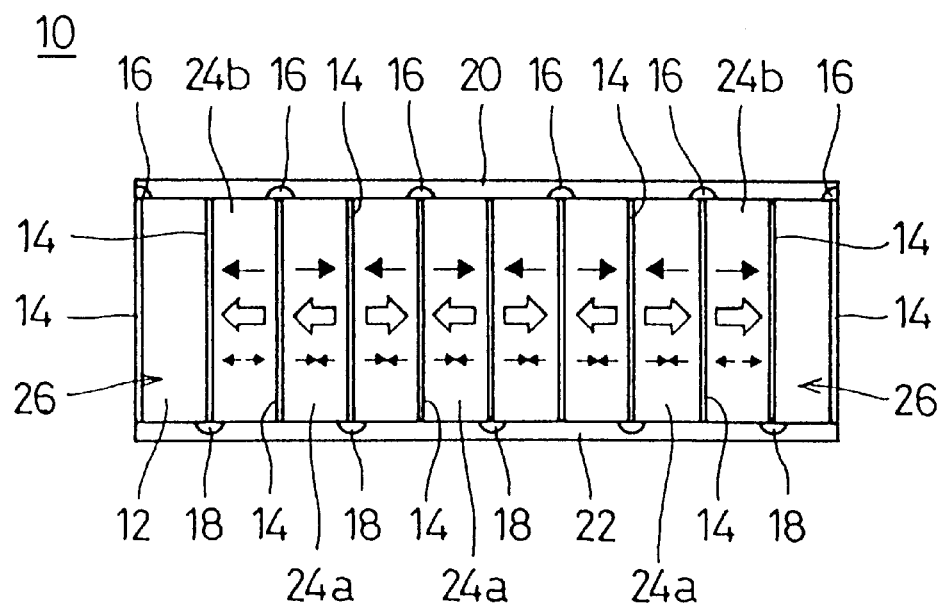
Figure 9:
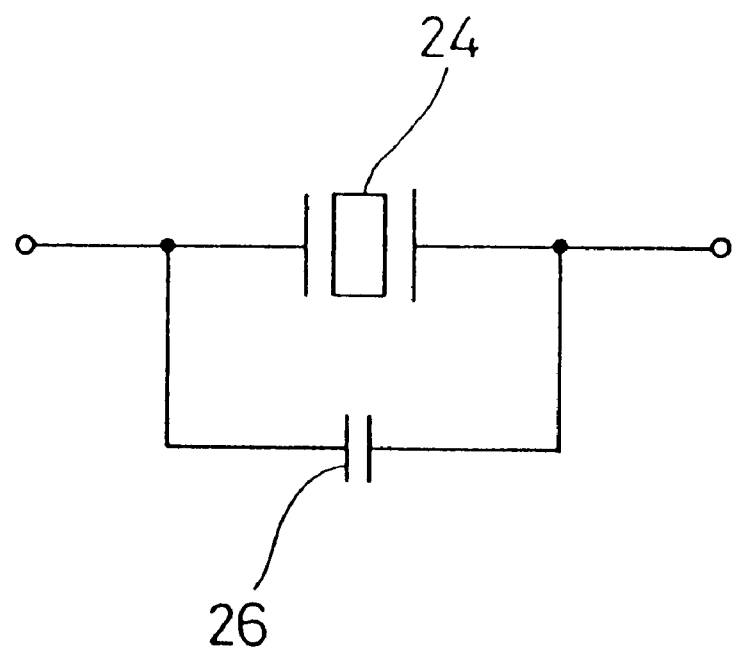
FIG. 9 is a circuit diagram of the piezoelectric resonator shown in FIG. 8.

FIGS. 8A and 8B illustrate a structure and vibration conditions of still another piezoelectric resonator according to the preferred embodiments of the present invention. FIG. 9 is a circuit diagram of the piezoelectric resonator shown in FIGS. 8A and 8B.

The piezoelectric resonator shown in FIGS. 8A and 8B has the same structure as the piezoelectric resonator described by referring to FIGS. 1 to 6 except that a base member 12 is formed such that capacitor sections 26 are integrally formed at both sides of second vibrating sections 24b.

The capacitor sections 26 are formed by piezoelectric layers which are not polarized such as PZT layers which are sandwiched by electrodes 14. One of the electrodes 14 sandwiching a capacitor section 26 is connected to an external electrode 20, and the other electrode 14 is connected to an external electrode 22. As shown in FIG. 9, the capacitor sections 26 are connected in parallel to the first vibrating section 24a and the second vibrating sections 24b.

Therefore, ΔF in longitudinal basic vibration can easily be changed by adjusting the capacitor sections 26 in the piezoelectric resonator 10 shown in FIGS. 8A and 8B. As the capacitance of the dielectric layers increases, for example, damping capacitance increases and ΔF decreases.

In the piezoelectric resonator 10 shown in FIGS. 8A and 8B, ΔF can be adjusted in a wide range and a high degree of freedom and flexibility is provided in design of the resonator characteristics. Therefore, the piezoelectric resonator 10 can have a small ΔF so as to be well suited for use as a narrow-frequency-band filter and an oscillator.

In the piezoelectric resonator 10 shown in FIGS. 8A and 8B, by changing the ratio of the first vibrating section 24a and the second vibrating sections 24b to the capacitor sections 26, or by changing the positions of the capacitor sections 26 in relation to those of the first vibrating section 24a and the second vibrating sections 24b, ΔF can be selected from a wide range. In the piezoelectric resonator 10 shown in FIGS. 8A and 8B, for example, the capacitor sections 26 are preferably disposed at both sides of the base member 12. The structure is not limited to that arrangement in this preferred embodiment. The capacitor sections 26 may also be disposed substantially at the center of the base member 12. Then, ΔF becomes small.

In the piezoelectric resonator 10 shown in FIGS. 8A and 8B, the capacitance of the entire piezoelectric resonator 10 can be increased by adjusting the capacitance of the capacitor sections 26. The capacitance of the capacitor sections 26 is adjusted by changing the overlapping area of the opposing portions of electrodes 14 or the thickness of the dielectric layers.

The capacitor sections 26 may be formed by laminating a plurality of dielectric layers with electrodes 14 disposed therebetween. Also in this case, the capacitor sections 26 are connected in parallel to the vibrating sections 24a and 24b. As the number of laminated layers increases, ΔF becomes smaller and the capacitance increases.

Various materials having dielectric constants can be used as a material for the capacitor sections 26, in addition to PZT. A material having a larger dielectric constant than PZT, such as $BaTiO_3$, may also be used.

Figure 11:
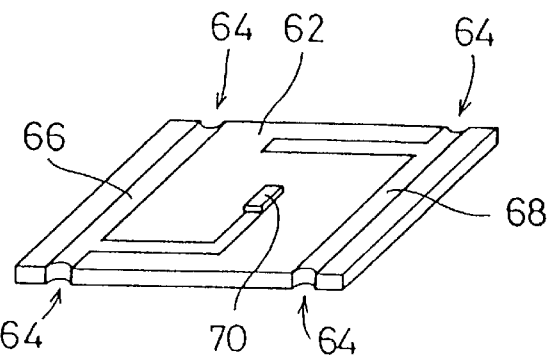
FIG. 11 is a perspective view of an insulating substrate used in the electronic component shown in FIG. 10.
Figure 12:
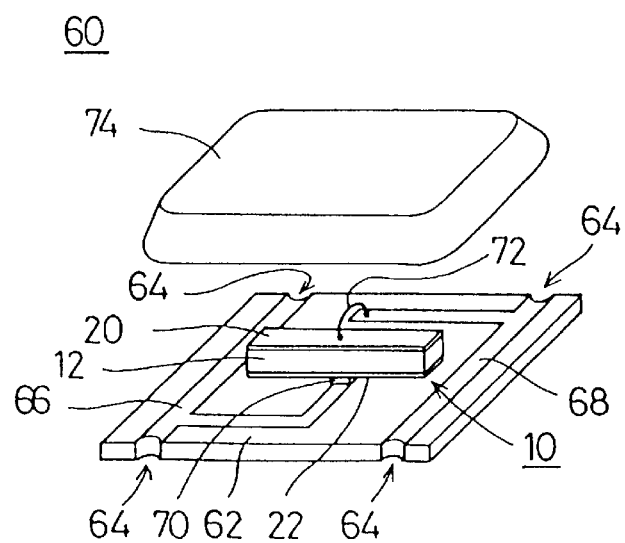
FIG. 12 is an exploded perspective view of the electronic component shown in FIG. 10.

An electronic component such as an oscillator and a discriminator including a piezoelectric resonator having the above-described structure will be described below by referring to FIGS. 10 to 12. The piezoelectric resonator 10 used in the electronic component may be identical to the piezoelectric resonator described by referring to FIGS. 1 to 6, the piezoelectric resonator shown in FIGS. 7A and 7B, or the piezoelectric resonator shown in FIGS. 8A and 8B.

Figure 10:
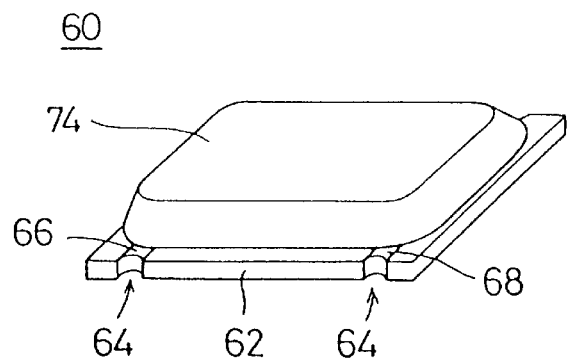
FIG. 10 is a perspective view of an electronic component using the piezoelectric resonator according to the preferred embodiments of the present invention.

FIG. 10 is a perspective view of the electronic component 60. The electronic component 60 includes an insulating substrate 62. At opposing end portions of the insulating substrate 62, two indentations 64 are preferably formed, respectively. On one surface of the insulating substrate 62, two pattern electrodes 66 and 68 are disposed as shown in FIG. 11. One pattern electrode 66 is arranged between opposing indentations 64 and extends in an L-shaped manner from a point near one end toward the center of the insulating substrate 62. The other pattern electrode 68 is arranged between the other opposing indentations 64 and extends substantially straight from a point near the other end toward the center of the insulating substrate 62. The pattern electrodes 66 and 68 are arranged such that they are routed in a roundabout fashion from the ends of the insulating substrate 62 to the opposite surface.

At one end of the pattern electrode 66 disposed at the center of the insulating substrate 62, a mounting member 70 is formed with electrically conductive adhesive. As shown in FIG. 12, the above-described piezoelectric resonator 10 is mounted on the mounting member 70 such that the center of the base member 12 is preferably disposed on the mounting member 70. An external electrode 22 of the piezoelectric resonator 10 is, for example, united with the mounting member 70 to connect to the pattern electrode 66. The other external electrode 20 is connected to the pattern electrode 68 preferably with electrically conductive wire 72. The electrically conductive wire 72 is connected to the center of the external electrode 20 of the piezoelectric resonator 10 in the longitudinal direction.

A metal cap 74 is placed on the insulating substrate 62 to complete the electronic component 60. To prevent the metal cap 74 from being short-circuited to the pattern electrodes 66 and 68, insulating resin or other suitable material preferably is applied to the insulating substrate 62 and the pattern electrodes 66 and 68 in advance. The electronic component 60 uses the pattern electrodes 66 and 68, which are formed such that they are routed to the rear surface from ends of the insulating substrate 62, as input and output terminals for connecting to external circuits.

Since the center of the piezoelectric resonator 10 in the longitudinal direction is secured to the mounting member 70 in the electronic component 60, the ends of the piezoelectric resonator 10 are disposed separately from the insulating substrate 62 so vibration is not prevented or damped. Longitudinal vibration is not weakened because the center of the piezoelectric resonator 10, which serves as a node, is secured to the mounting member 70 and is connected to the electrically conductive wire 72.

The electronic component 60 is preferably mounted on a circuit board together with IC chips and other components to form an oscillator or a discriminator. Since the electronic component 60 is sealed and protected by the metal cap 74, it can be used as a chip-type, surface-mountable component which can be mounted by reflow soldering or other suitable method.

When the electronic component 60 is used in an oscillator, spurious vibrations are suppressed to a low level and unusual vibration caused by the spurious vibrations are prevented as a result of the features of the piezoelectric resonator 10 used in the electronic component 60. It is also easy to achieve impedance matching with an external circuit since the capacitance of the piezoelectric resonator 10 can easily be set to any desired value.

When the electronic component 60 is used for a discriminator, a narrow peak-separation range is achieved due to a small ΔF of the resonator. In addition, since the resonator provides a wide range in capacitance design, it is easy to achieve impedance matching with an external circuit.

Figure 13:
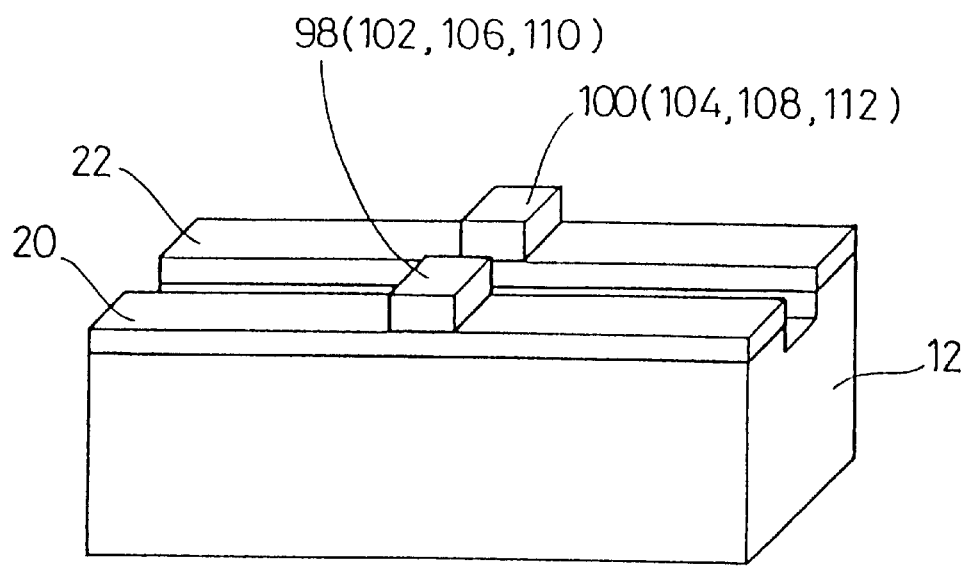
FIG. 13 is a perspective view of a further piezoelectric resonator according to the preferred embodiments of the present invention.
Figure 14:
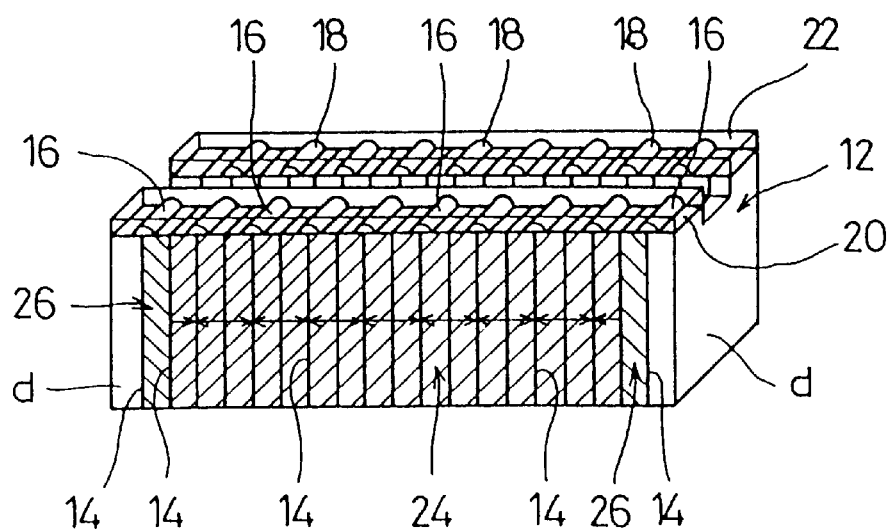
FIG. 14 is a view showing a structure of the piezoelectric resonator shown in FIG. 13.

FIG. 13 is a perspective view of a further piezoelectric resonator according to the preferred embodiments of the present invention. FIG. 14 is a view illustrating a structure of the piezoelectric resonator shown in FIG. 13. The piezoelectric resonator shown in FIGS. 13 and 14 has the same structure as the piezoelectric resonator described with FIGS. 1 to 6 except that two external electrodes 20 and 22 are disposed on a single side surface of the base member 12. Two rows of insulating films 16 and 18 are preferably provided on one side surface of the base member 12 and two rows of connection sections are formed. The insulating film 16 is disposed at one end in the width direction of the base member 12 and the insulating film 18 is disposed at the other end in the width direction of the base member 12. These two rows of insulating films 16 and 18 are disposed on respective alternate electrodes 14 such that the two rows of insulating films 16 and 18 are preferably provided on different electrodes 14. On these two rows of insulating films 16 and 18, two rows of external electrodes 20 and 22 are provided, respectively. The piezoelectric resonators 10 shown in FIGS. 13, 14 also achieve the same advantages as the piezoelectric resonator described above.

Since the two external electrodes 20 and 22 are disposed on one common side surface of the base member 12 in the piezoelectric resonator 10, the piezoelectric resonator 10 can be surface mounted on a circuit board to form an electronic component such as a ladder filter, an oscillator, or a discriminator. In other words, since the piezoelectric resonator 10 having the structure shown in FIG. 13 and 14 can be secured to the insulating substrate by surface-mounting without use of wire, an electronic component is manufactured more easily.

Figure 15:
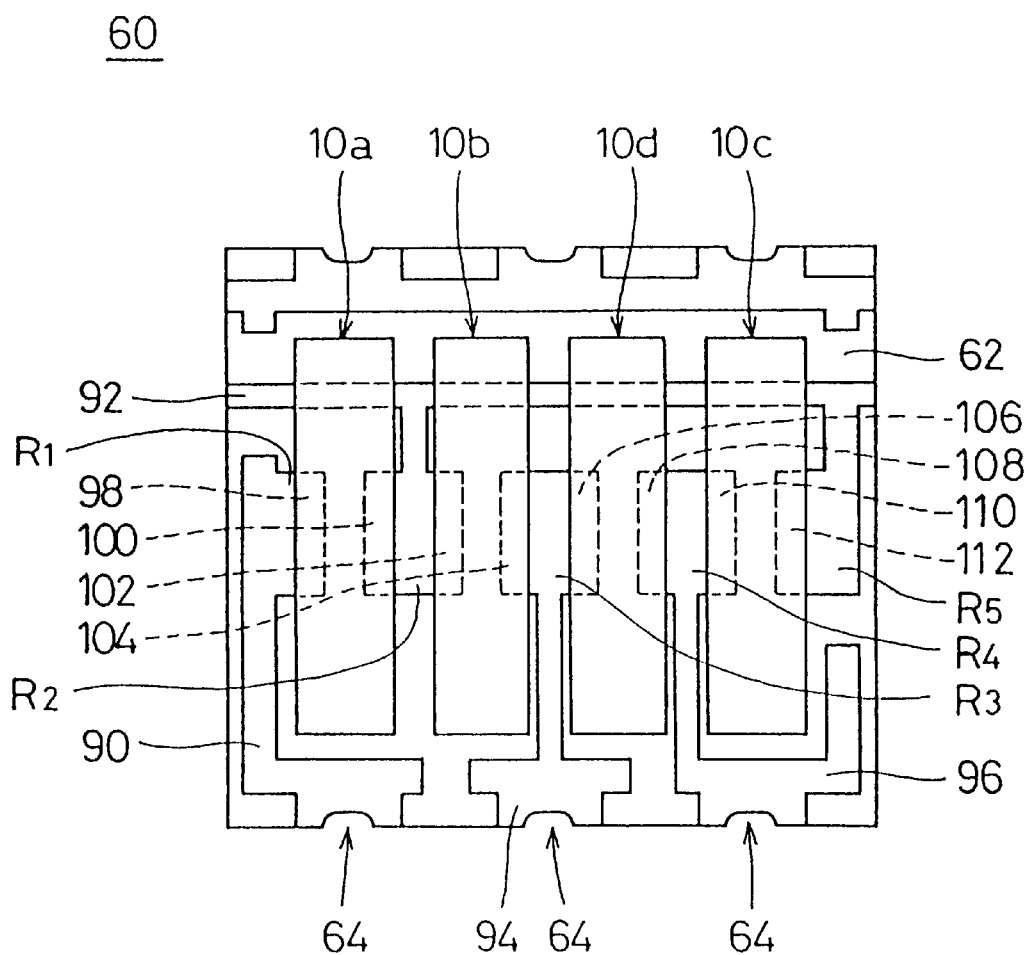
FIG. 15 is a perspective view of a main section of an electronic component containing the piezoelectric resonator shown in FIGS. 13 and 14.
Figure 16:
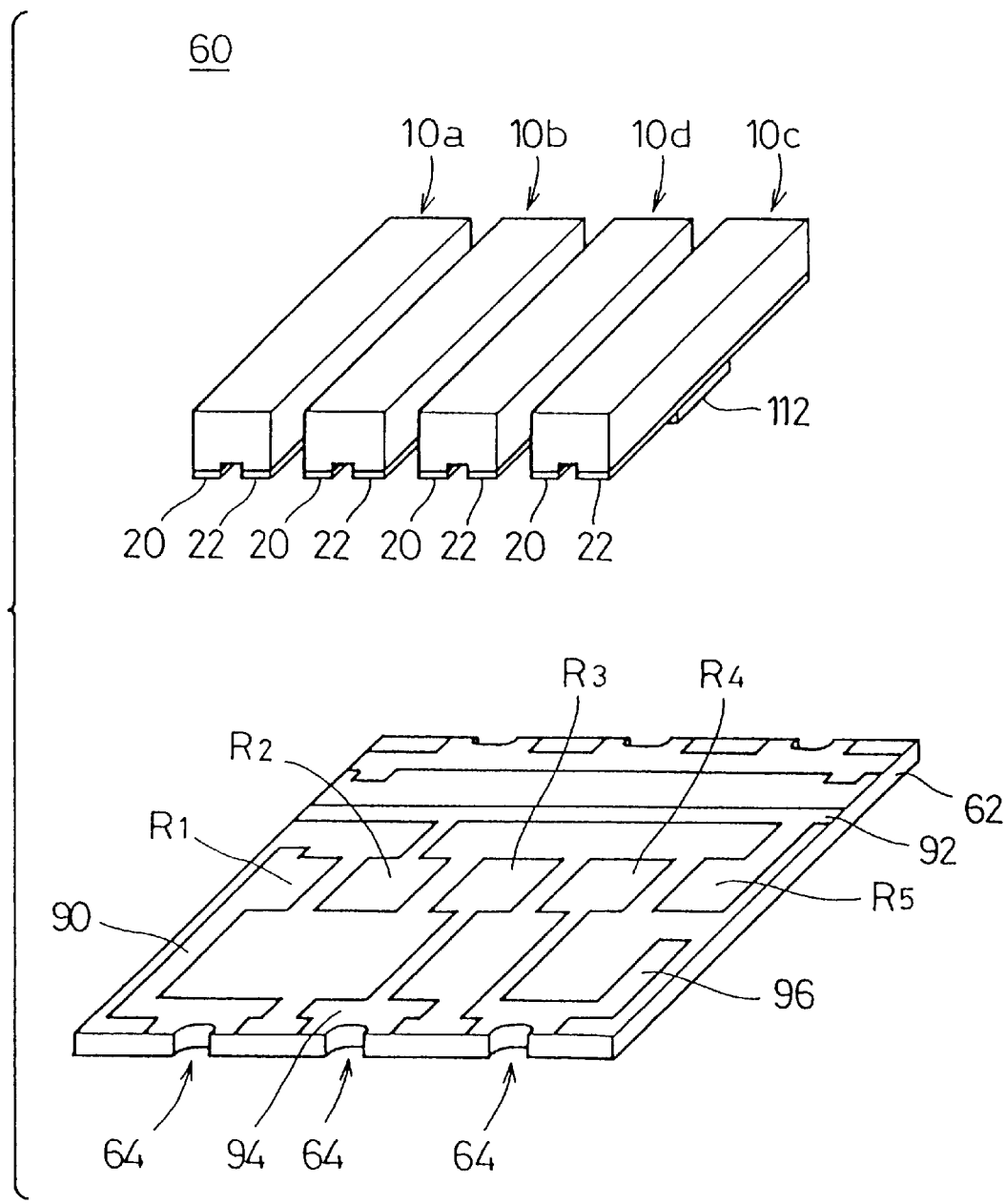
FIG. 16 is an exploded perspective view of the main section of the electronic component shown in FIG. 15.

FIG. 15 is a plan view of a main section of an electronic component using the piezoelectric resonator shown in FIGS. 13 and 14. FIG. 16 is an exploded perspective view of the main section. In the electronic component 60 shown in FIGS. 15 and 16, four piezoelectric resonators 10a, 10b, 10c, and 10d all of which have the structure shown in FIGS. 13 and 14 are used.

In the electronic component 60, four pattern electrodes 90, 92, 94, and 96 are disposed on an insulating substrate 62 serving as a support member, as shown in FIG. 16. Five lands disposed in line at a certain interval are connected to and extend from the pattern electrodes 90, 92, 94, and 96. The first land R1, which is closest to an end of the insulating substrate 62, is connected to the pattern electrode 90, the second land R2 and the fifth land R5 are connected to the pattern electrode 92, the third land R3 is connected to the pattern electrode 94, and the fourth land R4 is connected to the pattern electrode 96.

To connect the piezoelectric resonators 10a to 10d to the first land R1 to the fifth land R5, substantially rectangular-block-shaped mounting members 98, 100, 102, 104, 106, 108, 110, and 112 including surfaces made from an electrically conductive member are prepared. These mounting members are mounted to the electrodes 20 and 22 and are preferably disposed at the node sections of the piezoelectric resonators 10a to 10d in advance with electrically conductive adhesive as shown in FIG. 13.

The piezoelectric resonators 10a to 10d are turned upside down as shown in FIG. 16 and mounted preferably with electrically conductive adhesive in the following manner: one mounting member 98 on the first land R1; two mounting members 100 and 102 on the second land R2; two mounting members 104 and 106 on the third land R3; two mounting members 108 and 110 on the fourth land R4, and one mounting member 112 on the fifth land R5. In this case, the mounting members are preferably disposed in line and spaced at a certain interval as shown in FIG. 15.

Figure 17:
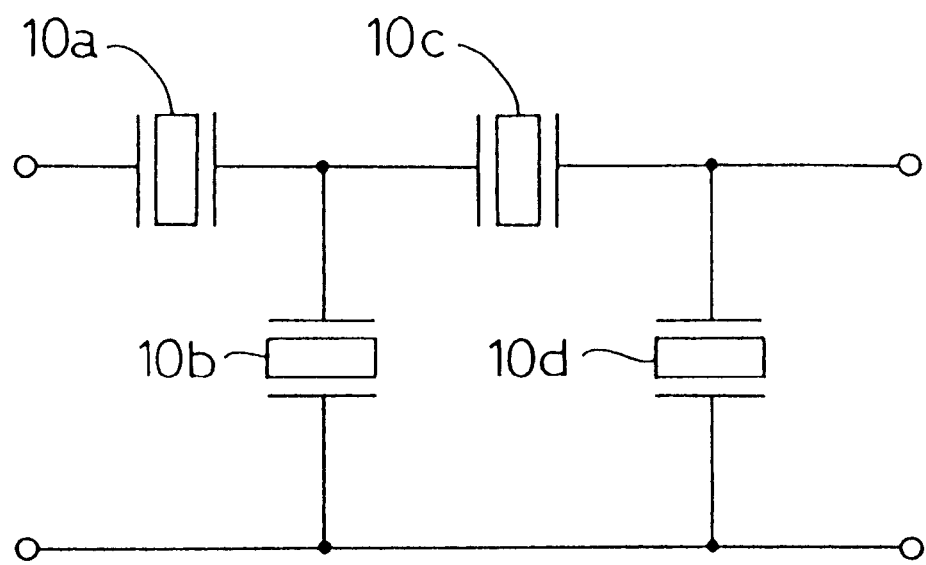
FIG. 17 is a circuit diagram of the electronic component shown in FIGS. 15 and 16.
Figure 18:
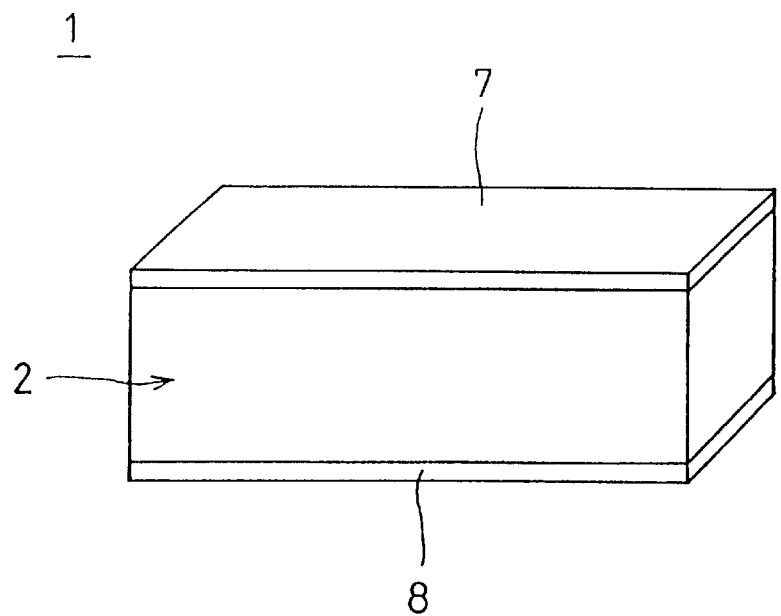
FIG. 18 is a perspective view of a piezoelectric resonator which the applicant has developed and not yet published.
Figure 19:
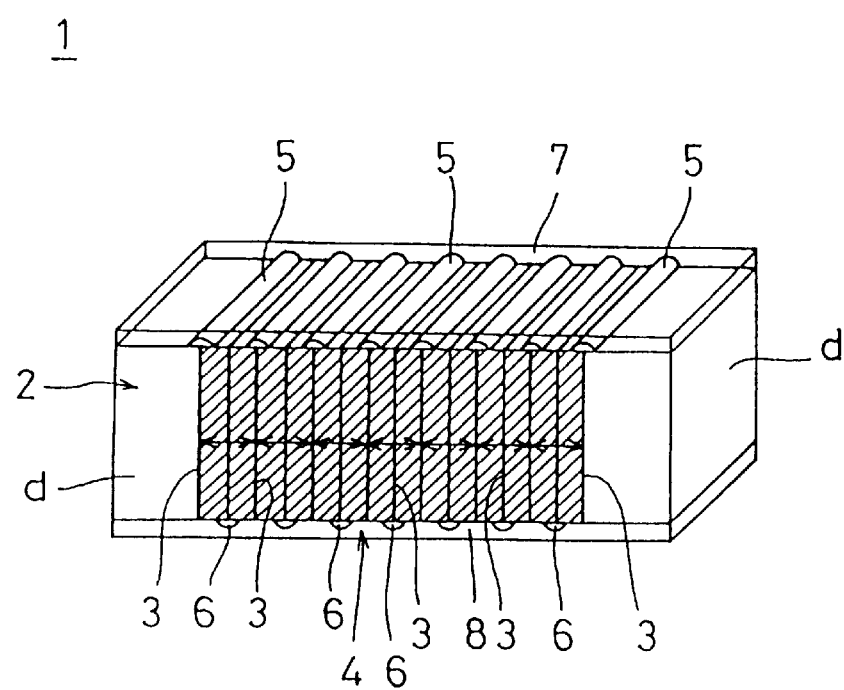
FIG. 19 is a view showing the internal structure of the piezoelectric resonator shown in FIG. 18.
Figure 20A:
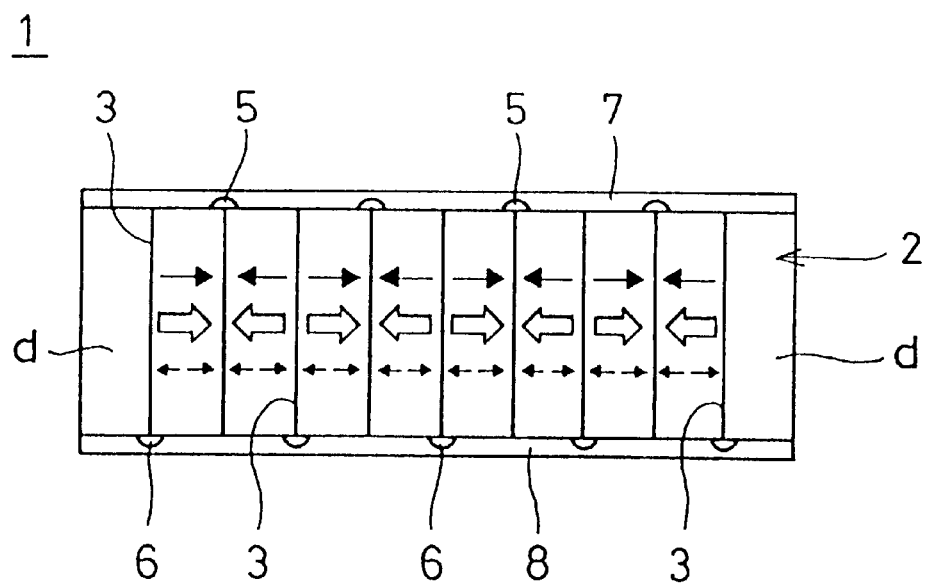
FIGS. 20A and 20B illustrate vibration conditions of the piezoelectric resonator shown in FIGS. 18 and 19.
Figure 20B:
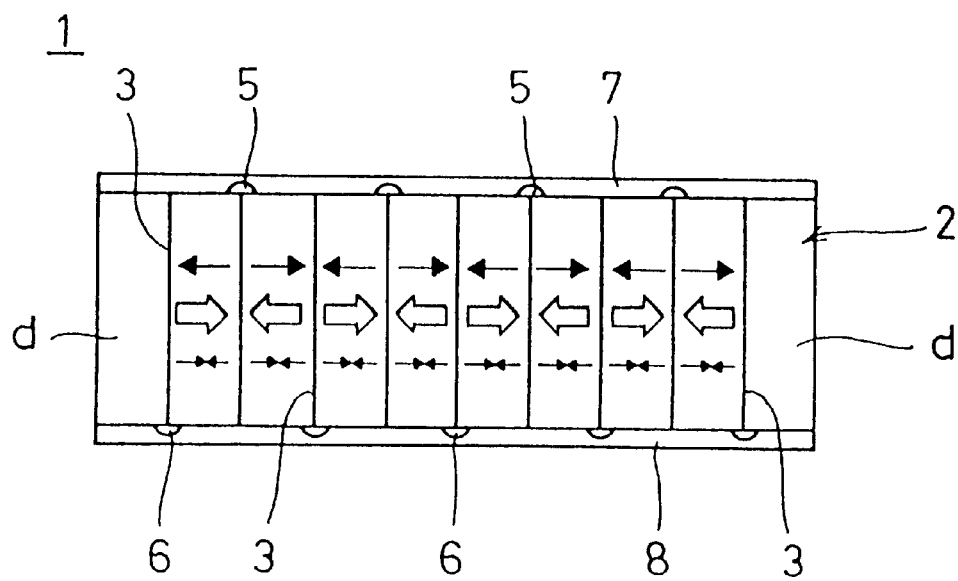

As described above, the four piezoelectric resonators 10a to 10d are supported on the insulating substrate 62 by the mounting members 98, 100, 102, 104, 106, 108, 110, and 112, and the electrodes 20 and 22 of the piezoelectric resonators are connected to the pattern electrodes 90, 92, 94, and 96 on the insulating substrate 62. The pattern electrodes are formed such that the ladder-shaped circuit shown in FIG. 17 is obtained. A metal cap (not shown) is placed on the insulating substrate 62.

The electronic component 60 is used as a ladder filter having the ladder-shaped circuit shown in FIG. 17. Two piezoelectric resonators 10a and 10c serve as series resonators and the other two piezoelectric resonator 10b and 10d serve as parallel resonators. In such a ladder filter, the parallel piezoelectric resonators 10b and 10d are designed to have substantially larger capacitances than the series piezoelectric resonators 10a and 10c.

Attenuation in the ladder filter is determined by the capacitance ratio between the series resonators and the parallel resonators. In this electronic component 60, a ladder filter having a larger attenuation with fewer resonators is achieved by changing the capacitances of the piezoelectric resonators 10a to 10d. Since the piezoelectric resonators 10a to 10d have a smaller ΔF, a ladder filter having a narrow transmission frequency band is achieved.

A ladder filter having a wide transmission band can be achieved by increasing the differences in ΔF between those of the piezoelectric resonators 10a and 10c connected in series and those of the piezoelectric resonators 10b and 10d connected in parallel by reducing ΔF of each of the former resonators 10a and 10c and by increasing ΔF of each of the latter resonators 10b and 10d.

In the electronic component shown in FIGS. 15 and 16, since one electrode of each of adjacent piezoelectric resonators is mounted on the same land via a mounting member, the two electrodes of the adjacent piezoelectric resonators do not need to be insulated and thus the adjacent resonators can be disposed closely, enabling a more compact component.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
   a base member;
   a laminated member section constituting a part of said base member and including alternately laminated piezoelectric layers polarized in a longitudinal direction of said base member and a plurality of electrodes disposed in said base member so as to be substantially perpendicular to the longitudinal direction of said base member, said laminated section including a first vibrating section and at least one second vibrating section;

a pair of external electrodes disposed on one of a common surface or different side surfaces of said base member so as to be connected to said plurality of electrodes in said base member;

at least one capacitor section provided on said base member such that said at least one second vibrating section is located between said first vibrating section and said capacitor section; wherein when an electric field is applied to at least one piezoelectric layer of said first vibrating section in the same direction as a direction of polarization of said at least one piezoelectric layer of said first vibrating section, an electric field is applied to at least one piezoelectric layer of said at least one second vibrating section in a direction opposite to the direction of polarization of said at least one piezoelectric layer of said at least one second vibrating section; and when an electric field is applied to said at least one piezoelectric layer of said first vibrating section in a direction opposite to the direction of polarization of said at least one piezoelectric layer of said first vibrating section, an electric field is applied to said at least one piezoelectric layer of said at least one second vibrating section in the same direction as the direction of polarization of said at least one piezoelectric layer of said at least one second vibrating section.

2. A piezoelectric resonator according to claim 1, wherein the at least one second vibrating section is provided at an end portion of said base member.

3. A piezoelectric resonator according to claim 1, further comprising a pair of said second vibrating sections, each of said pair of second vibrating sections being located at an opposite end portion of said base member.

4. A piezoelectric resonator according to claim 1, further comprising a dummy layer provided on said base member such that said at least one second vibrating section is located between said first vibrating section and said dummy layer.

5. A piezoelectric resonator according to claim 1, wherein said piezoelectric layers which are disposed closer to a center of said base member expand and contract more than said piezoelectric layers which are located farther away from said center of said base member.

6. A piezoelectric resonator according to claim 1, further comprising a dummy electrode disposed in said base member being arranged adjacent said at least one second vibrating section.

7. A piezoelectric resonator according to claim 6, wherein said dummy electrode is not electrically connected to said external electrodes.

8. A piezoelectric resonator according to claim 1, wherein said at least one second vibrating section includes at least two piezoelectric layers located adjacent said first vibrating section.

9. A piezoelectric resonator comprising:

a base member;

a laminated member section constituting a part of said base member and including alternately laminated piezoelectric layers polarized in a longitudinal direction of said base member and a plurality of electrodes disposed in said base member so as to be substantially perpendicular to the longitudinal direction of said base member;

a pair of external electrodes disposed on one of a common surface or different side surfaces of said base member so as to be connected to said plurality of electrodes in said base member; wherein said laminated member section includes a first vibrating section and at least one second vibrating section;

when an electric field is applied to at least one piezoelectric layer of said first vibrating section in the same direction as a direction of polarization of said at least one piezoelectric layer of said first vibrating section, an electric field is applied to at least one piezoelectric layer of said at least one second vibrating section in a direction opposite to the direction of polarization of said at least one piezoelectric layer of said at least one second vibrating section; and when an electric field is applied to said at least one piezoelectric layer of said first vibrating section in a direction opposite to the direction of polarization of said at least one piezoelectric layer of said first vibrating section, an electric field is applied to said at least one piezoelectric layer of said at least one second vibrating section in the same direction as the direction of polarization of said at least one piezoelectric layer of said at least one second vibrating section;

a pair of said second vibrating sections and a pair of capacitor sections disposed at opposite ends of said base member such that each of said pair of second vibrating sections is located between said first vibrating section and one of said pair of said capacitor sections.

10. An electronic component comprising:

a piezoelectric resonator including a base member, a laminated member section constituting a part of said base member and including alternatively laminated piezoelectric layers polarized in a longitudinal direction of said base member and a plurality of electrodes disposed in said base member so as to be substantially perpendicular to the longitudinal direction of said base member, a pair of external electrodes disposed on one of a common surface or different side surfaces of said base member so as to be connected to said plurality of electrodes in said base member; wherein said laminated member section includes a first vibrating section and at least one second vibrating section, when an electric field is applied to at least one piezoelectric layer of said first vibrating section in the same direction as a direction of polarization of said at least one piezoelectric layer of said first vibrating section, an electric field is applied to at least one piezoelectric layer of said at least one second vibrating section in a direction opposite to the direction of polarization of said at least one piezoelectric layer of said at least one second vibrating section, and when an electric field is applied to said at least one piezoelectric layer of said first vibrating section in a direction opposite to the direction of polarization of said at least one piezoelectric layer of said first vibrating section, an electric field is applied to said at least one piezoelectric layer of said at least one second vibrating section in the same direction as the direction of polarization of said at least one piezoelectric layer of said at least one second vibrating section;

a support member supporting said base member; and a cap disposed on said support member so as to cover said base member; wherein said support member includes an insulating substrate having a pattern electrode disposed on a surface of said support member and said pattern electrode is electrically connected to said plurality of electrodes.

11. An electronic component according to claim 10, wherein the at least one second vibrating section is provided at an end portion of said base member.

12. An electronic component according to claim 10, wherein said piezoelectric resonator further includes a pair of said second vibrating sections, each of said pair of second vibrating sections being located at an opposite end portion of said base member.

13. An electronic component according to claim 10, wherein said piezoelectric resonator further includes a dummy layer provided on said base member such that said at least one second vibrating section is located between said first vibrating section and said dummy layer.

14. An electronic component according to claim 10, wherein said piezoelectric layers which are disposed closer to a center of said base member expand and contract more than said piezoelectric layers which are located farther away from said center of said base member.

15. An electronic component comprising:
- a piezoelectric resonator including a base member, a laminated member section constituting a part of said base member and including alternatively laminated piezoelectric layers polarized in a longitudinal direction of said base member and a plurality of electrodes disposed in said base member so as to be substantially perpendicular to the longitudinal direction of said base member, a pair of external electrodes disposed on one of a common surface or different side surfaces of said base member so as to be connected to said plurality of electrodes in said base member; wherein said laminated member section includes a first vibrating section and at least one second vibrating section, when an electric field is applied to at least one piezoelectric layer of said first vibrating section in the same direction as a direction of polarization of said at least one piezoelectric layer of said first vibrating section, an electric field is applied to at least one piezoelectric layer of said at least one second vibrating section in a direction opposite to the direction of polarization of said at least one piezoelectric layer of said at least one second vibrating section, and when an electric field is applied to said at least one piezoelectric layer of said first vibrating section in a direction opposite to the direction of polarization of said at least one piezoelectric layer of said first vibrating section, an electric field is applied to said at least one piezoelectric layer of said at least one second vibrating section in the same direction as the direction of polarization of said at least one piezoelectric layer of said at least one second vibrating section;
- and a support member supporting said base member;
- a cap disposed on said support member so as to cover said base member; and
- a mounting member, wherein said base member is mounted on said support member via said mounting member for supporting a center section of said base member of said piezoelectric resonator in the longitudinal direction of said piezoelectric resonator.

16. An electronic component comprising:
- a plurality of piezoelectric resonators, each of said plurality of piezoelectric resonators including a base member, a laminated member section constituting a part of said base member and including alternately laminated piezoelectric layers polarized in a longitudinal direction of said base member and a plurality of electrodes disposed in said base member so as to be substantially perpendicular to the longitudinal direction of said base member, and a pair of external electrodes disposed on one of a common surface or different side surfaces of said base member so as to be connected to said plurality of electrodes in said base member, wherein said laminated member section includes a first vibrating section and at least one second vibrating section, when an electric field is applied to at least one piezoelectric layer of said first vibrating section in the same direction as a direction of polarization of said at least one piezoelectric layer of said first vibrating section, an electric field is applied to at least one piezoelectric layer of said at least one section vibrating section in a direction opposite to the direction of polarization of said at least one piezoelectric layer of said at least one second vibrating section, and when an electric field is applied to said at least one piezoelectric layer of said first vibrating section in a direction opposite to the direction of polarization of said at least one piezoelectric layer of said first vibrating section, an electric field is applied to said at least one piezoelectric layer of said at least one second vibrating section in the same direction as the direction of polarization of said at least one piezoelectric layer of said at least one second vibrating section, wherein said plurality of resonators are connected in a ladder arrangement in series and in parallel;
- a support member supporting said plurality of resonators; and
- a cap disposed on said substrate so as to cover said plurality of resonators; wherein
    said support member includes an insulating substrate having a pattern electrode disposed on a surface of said support member and said pattern electrode is electrically connected to said plurality of electrodes of said plurality of piezoelectric resonators.

17. An electronic component according to claim 16, further comprising a plurality mounting members, wherein said base member of each of said plurality of resonators is mounted on said support member via a respective one of said mounting members for supporting a center section of said base member of said plurality of piezoelectric resonators in the longitudinal direction of said plurality of piezoelectric resonators.

* * * * *